(12) United States Patent
Mora et al.

(10) Patent No.: US 6,748,576 B2
(45) Date of Patent: Jun. 8, 2004

(54) ACTIVE TRACE REROUTING

(75) Inventors: Leonard L. Mora, San Jose, CA (US); Abiola A. Awujoola, Union City, CA (US); Jeffrey A. Hall, Kamakura (JP)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/155,260

(22) Filed: May 24, 2002

(65) Prior Publication Data

US 2003/0221178 A1 Nov. 27, 2003

(51) Int. Cl.$^7$ .............................................. G06F 17/50
(52) U.S. Cl. ........................ 716/15; 716/10; 716/12
(58) Field of Search ........................................ 716/7–15

(56) References Cited

U.S. PATENT DOCUMENTS

| | | | | |
|---|---|---|---|---|
| 5,258,920 A | * | 11/1993 | Haller et al. ................... 716/12 |
| 5,441,917 A | * | 8/1995 | Rostoker et al. ............. 438/612 |
| 5,753,970 A | * | 5/1998 | Rostoker ..................... 257/668 |
| 5,834,336 A | * | 11/1998 | Maheshwari et al. ........ 438/118 |
| 6,181,569 B1 | * | 1/2001 | Chakravorty ................ 361/761 |
| 6,388,318 B1 | * | 5/2002 | Iwaya et al. ................. 257/723 |
| 6,444,501 B1 | * | 9/2002 | Bolken ........................ 438/127 |
| 6,574,780 B2 | * | 6/2003 | Le Coz .......................... 716/8 |

* cited by examiner

Primary Examiner—Vuthe Siek
Assistant Examiner—Paul Dinh
(74) Attorney, Agent, or Firm—Luedeka, Neely & Graham, P.C.

(57) ABSTRACT

A substrate of the type for receiving an integrated circuit and a mold cover. The mold cover covers a first portion of the substrate and leaves a second portion of the substrate exposed with a boundary edge between the first portion of the substrate and a second portion of the substrate. The substrate has electrically conductive traces and electrically conductive vias on an upper layer adjacent the mold cover. The electrically conductive traces do not cross the boundary edge on the upper layer of the substrate.

12 Claims, 2 Drawing Sheets

ACTIVE TRACE REROUTING

FIELD

This invention relates to the field of integrated circuit fabrication. More particularly, this invention relates to integrated circuit design.

BACKGROUND

Typically, one of the greatest expenses in fabricating an integrated circuit is the cost of the labor required to manufacture and package the device. Thus, while costs are none-the-less impacted by the loss of an integrated circuit early on in processing, such losses represent more the loss of anticipated revenue alone. However, the loss of a device near or at the end of the processing represents not only the loss of anticipated revenue, but the loss of actual labor costs that were incurred to process the device to the point at which it failed. This is particularly compounded by the fact that after the integrated circuits are diced and separated one from another, the labor required to complete a packaged device tends to be more individually devoted to a single device, thereby amplifying the labor costs that were previously divided between all integrated circuits on a single substrate. Further, the packaging for a device tends to have a significant material cost associated with it. Therefore, failures of packaged devices tend to be the costliest of all.

Ensuring that devices survive the fabrication process and are functional and reliable is one of the primary goals of failure analysis. Failure analysis attempts to analyze a failed device, including both the integrated circuit and the package, to determine the cause of failure and then feed back the information to the appropriate source so that procedures can be instituted to prevent future failures of the same type. Unfortunately, accomplishing effective failure analysis is often a difficult thing to do.

For example, failures may be cause by a great variety of problems, and it often is not clear which factors are contributing to the failures. As a more specific example, it is often difficult to determine whether a failure is a design flaw, a processing flaw, an execution flaw, or a combination of these flaws. A design flaw is one in which the process produces the device as designed, and the process was executed correctly, but the design of the device itself is not reliable. A processing flaw is one in which the fundamental design of the device is sound, and the process was executed correctly, but the process is not capable to reliably produce the device. Finally, an execution flaw is one in which the design and the process are both sound, but the process was not executed properly.

Unfortunately, it is very difficult to determine which of the problems is contributing to a given failure, especially when the failure may be sporadic, and more especially when different components of all three of the primary factors described above may be contributing to the failure. For example, it has been observed that the electrically conductive traces on a substrate, such as a circuit board to which circuits are mounted, tend to crack near the corners and edges of the substrate. A failure such as this could possibly have its roots in any one or more of design flaws, processing flaws, or execution flaws.

What is needed, therefore, is a solution to the problem of electrically conductive traces that crack in the corners of packaged devices.

SUMMARY

The above and other needs are met by a substrate of the type for receiving an integrated circuit and a mold cover. The mold cover covers a first portion of the substrate and leaves a second portion of the substrate exposed with a boundary edge between the first portion of the substrate and a second portion of the substrate. The substrate has electrically conductive traces and electrically conductive vias on an upper layer adjacent the mold cover. The electrically conductive traces do not cross the boundary edge on the upper layer of the substrate.

Thus, it has been advantageously discovered that by having no electrically conductive traces that underlie the edges of the mold cover, the incidence of cracked electrically conductive traces in the corners and edges of the substrate is greatly reduced. In this manner the yield of packaged devices is improved.

In a preferred embodiment of the invention, the boundary edge, across which no electrically conductive traces extend, extends completely around the peripheral edges of the substrate. According to other aspects of the invention there are provided a packaged device that includes the substrate as described above, a method of fabricating a packaged device, and a method of designing a substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
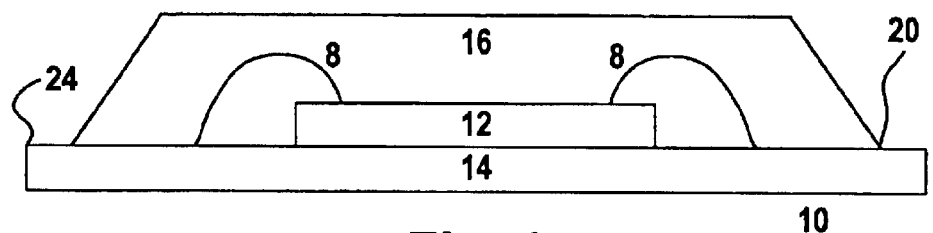
FIG. 1 is a cross sectional view of a packaged wire bond device according to a preferred embodiment of the present invention.

With reference now to FIG. 1 there is depicted a cross sectional view of a packaged device 10 according to a preferred embodiment of the present invention. An integrated circuit 12 is mounted and electrically connected to a substrate 14, such as by wire bonds 8. It is appreciated that other electrical connections besides wire bonds 8 are comprehended by the present invention, such as bump bonding and tab bonding. In addition, it is further comprehended that there may be more than one integrated circuit 12 mounted to the substrate 14. The integrated circuit 12 is encapsulated such as by a mold cover 16.

Most preferably, the mold cover 16 does not extend completely to the peripheral edge 24 of the substrate 14, but extends to a boundary edge 20. Thus, a first portion of the substrate 14 is covered by the mold cover 16, and a second portion of the substrate 14 is left exposed by the mold cover 16. The two portions are logically separated by the boundary edge 20, which is the edge of the mold cover 16.

Figure 2:
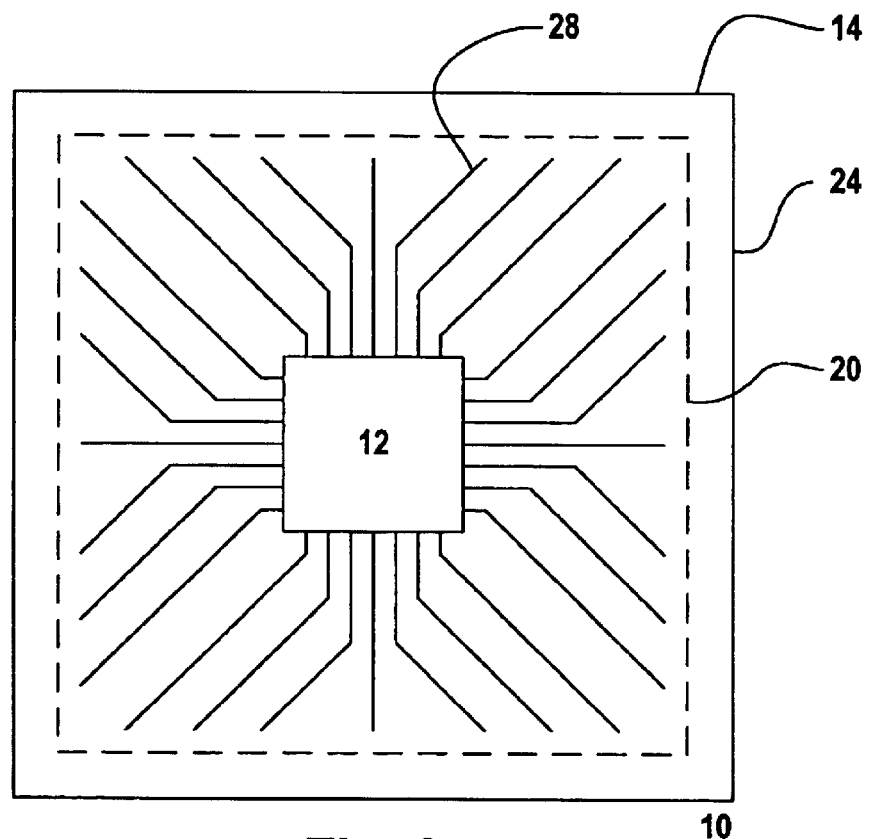
FIG. 2 is a top plan view of a portion of a packaged flip chip device according to a preferred embodiment of the present invention, showing more detail on the boundary edge and the layout of the electrically conductive traces.

Referring now to FIG. 2 there is depicted a top plan view of the packaged device 10 according to a preferred embodiment of the present invention, in which the mold cover 16 is not depicted, so as to better see the other parts of the packaged device 10. The integrated circuit 12, which in FIG. 2 is a bump bonded device, is mounted on an upper surface of the substrate 14, and makes electrical connections through solder bumps to electrically conductive traces 28, which route the electrical signals out from the integrated circuit 12 to other portions of the substrate 14. It is appreciated that only a few electrically conductive traces 28 have been depicted in FIG. 2, which electrically conductive traces 28 have been disposed in a representational fashion. In actual implementation there would preferably be a far greater number of electrically conductive traces 28 on the surface of the substrate 14.

The boundary edge 20 is depicted in FIG. 2 as a dashed line. In the embodiment depicted in FIG. 2, the boundary edge 20 extends completely around the peripheral edge 24 of the substrate 14. As depicted in FIG. 2, none of the electrically conductive traces 28 cross over the boundary edge 20. The boundary edge 20 is where the edges of the mold cover 16 are disposed, as described above, which is the boundary between the covered portions of the substrate 14 and the exposed portions of the substrate 14. It has been discovered by the present inventors that electrically conductive traces 28 which traverse the edges of the mold cover 16 have a tendency to crack at or near the boundary edge 20, thus resulting in failure of the packaged device 10.

Figure 3:
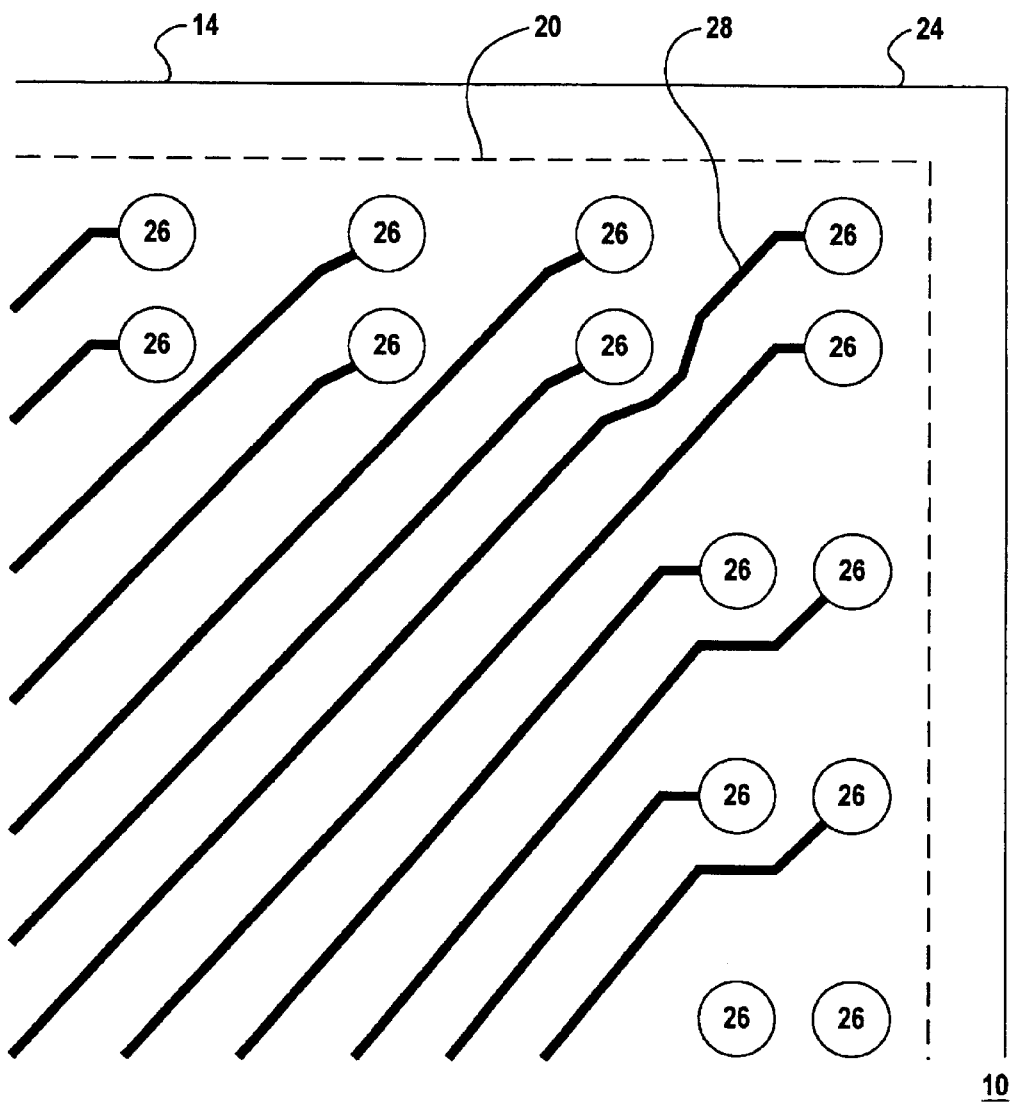
FIG. 3 is a top plan view of a corner portion of the substrate according to a preferred embodiment of the present invention, showing even more detail on the boundary edge and the layout of the electrically conductive traces and the vias.

With reference now to FIG. 3 there is depicted a top plan view of a corner portion of the packaged device 10 according to a preferred embodiment of the present invention, showing even more detail of the boundary edge 20 and the layout of the electrically conductive traces 28. Also depicted in FIG. 3 are electrically conductive vias 26, which make electrical connections between the electrically conductive traces 28 and signal carrying elements on underlying layers of the substrate 14. As depicted in FIG. 3, none of the vias 26 are disposed in the exposed portion of the substrate 14, between the boundary edge 20 and the peripheral edge 24, so that none of the electrically conductive traces 28 on the upper surface of the substrate 14 have to run across the boundary edge 20.

It is appreciated that only a few vias 26 have been depicted in FIG. 3, which vias 26 have been disposed in a representational fashion. In actual implementation there would preferably be a far greater number of vias 26 in the surface of the substrate 14. It is further appreciated that the distance between the boundary edge 20 and the peripheral edge 24 preferably varies according to other existing constraints of the packaged device 10, such as the existing design of the equipment that fashions the mold cover 16 on the substrate 14. Although such equipment could be modified so as to move the boundary edge 20 to the peripheral edge 24 of the substrate 14, such modifications tend to be cost prohibitive. Thus, changing the design of the substrate 14 as described herein to move the electrically conductive traces 28 within the mold cover 16 also prevents cracking of the electrically conductive traces 28, and at a lower cost.

In a most preferred embodiment, the electrically conductive traces 28 are no closer to the boundary edge 20 than about fifty microns or so, as it has been determined that higher stresses exist even within the mold cover 16 within this distance of the boundary edge 20.

In a preferred embodiment of a method of fabricating a packaged device 10 according to the present invention, the integrated circuit 12 is electrically mounted to the substrate 14. The substrate 14 preferably has no electrically conductive traces 28 or vias 26 which cross the boundary edge 20. A mold cover 16 is attached to the substrate 14, where the mold cover 16 has an edge at the boundary edge 20.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In substrate of the type for receiving an integrated circuit and a mold cover that covers a first portion of the substrate and leaves a second portion of the substrate exposed with a boundary edge between the first portion of the substrate and a second portion of the substrate, the substrate having electrically conductive traces and electrically conductive vias on an upper layer adjacent the mold cover, the improvement comprising no electrically conductive traces that cross the boundary edge on the upper layer of the substrate.

2. The substrate of claim 1 wherein the boundary edge extends completely around a peripheral edge of the substrate.

3. The substrate of claim 1 wherein the electrically conductive traces are no closer than about fifty microns to the boundary edge.

4. A packaged device comprising an integrated circuit, a mold cover, and the substrate of claim 1.

5. A method of fabricating a packaged device, the method comprising the steps of:

electrically mounting an integrated circuit to a substrate having a boundary edge, where the substrate has no electrically conductive traces that cross the boundary edge, and forming a mold cover on the substrate, where the mold cover has an edge at the boundary edge.

6. The method of claim 5, wherein the boundary edge extends completely around a peripheral edge of the substrate.

7. The method of claim 5 wherein the electrically conductive traces are no closer than about fifty microns to the boundary edge.

8. A packaged device fabricated according to the method of claim 5.

9. In a method of designing a substrate of the type for receiving an integrated circuit and a mold cover that covers a first portion of the substrate and leaves a second portion of the substrate exposed with a boundary edge between the first portion of the substrate and a second portion of the substrate the improvement comprising the step of laying out electrically conductive traces on an upper surface of the substrate such that the electrically conductive traces do not cross the boundary edge.

10. The method of claim 9, wherein the boundary edge extends completely around a peripheral edge of the substrate.

11. The method of claim 9 wherein the electrically conductive traces are no closer than about fifty microns to the boundary edge.

12. A substrate designed according to the method of claim 9.

* * * * *